United States Patent [19]
MacGregor et al.

[11] Patent Number: 5,477,418
[45] Date of Patent: Dec. 19, 1995

[54] I/O CONNECTOR FOR ADD IN PRINTED CIRCUIT CARDS FOR COMPUTER SYSTEMS

[75] Inventors: Duncan D. MacGregor, Shingle Springs; Neal E. Broadbent, El Dorado Hills; Chengwu Chen, Sacramento; Richard Gargiulo, Folsom, all of Calif.

[73] Assignee: Intel Corporation, Santa Clara, Calif.

[21] Appl. No.: 275,599

[22] Filed: Jul. 15, 1994

[51] Int. Cl.⁶ .................................................. H05K 1/14
[52] U.S. Cl. ...................... 361/737; 361/741; 361/752; 361/756; 361/802; 439/44
[58] Field of Search .................................. 361/737, 741, 361/740, 752, 756, 796, 802; 235/441, 486, 487, 492; 206/328–331; 439/44, 74; 365/52

[56] References Cited

U.S. PATENT DOCUMENTS

| | | |
|---|---|---|
| Re. 34,369 | 9/1993 | Darden et al. |
| 4,530,069 | 7/1985 | Desrochers |
| 4,695,925 | 9/1987 | Kodai et al. |
| 4,811,165 | 3/1989 | Currier et al. |
| 4,870,793 | 10/1989 | Ohtsuki ............................... 361/399 |
| 4,951,280 | 8/1990 | McCool et al. |
| 5,183,404 | 2/1993 | Aldous et al. |
| 5,184,282 | 2/1993 | Kaneda et al. |
| 5,207,586 | 5/1993 | MacGregor et al. |
| 5,272,477 | 12/1993 | Tashima et al. |
| 5,285,057 | 2/1994 | Murohara |
| 5,296,692 | 3/1994 | Shino |
| 5,296,850 | 3/1994 | King |
| 5,303,121 | 4/1994 | Thornberg |
| 5,313,364 | 5/1994 | Omori et al. |
| 5,331,509 | 7/1994 | Kikinis ................................. 361/686 |

OTHER PUBLICATIONS

No Author, *PCMCIA, Personal Computer Memory Card International Association PC Card Standard Release 2.0*, 3–13 through 3–26 (Sep. 1991).
No Author, *PCMCIA, Recommended Extensions, Release 1.00*, 1–3 through 1–8 (1992).
No Author, *Miu Industries Ltd.*, Company Overview, pp. 1 through 3 (1994).
No Author, *The Session Key Data Security Solution*, Company Brochure.

*Primary Examiner*—Leo P. Picard
*Assistant Examiner*—Y. Whang
*Attorney, Agent, or Firm*—Blakely, Sokoloff, Taylor & Zafman

[57] ABSTRACT

A connector system for an add in PC card for supplying network communications functions to a host computer wherein the connector to the network is a RJ type universal jack consisting of a socket and plug. A cavity in the card is formed by an opening in the short dimension of the frame opposite the 68 position connector and the top and bottom covers. A carriage is mounted in the cavity so that it can slide in and out and occupy at least two positions. The carriage consists of a socket portion for making contact with the RJ type plug and a support and contact portion that mechanically supports the carriage within the card and also makes the electrical contact between the carriage and the card. In the first of the two positions, substantially all of the carriage is within the cavity. In the second of the two positions, the socket portion of the carriage is outside of the cavity. In this position, the socket is electrically connected to the printed circuit board.

19 Claims, 12 Drawing Sheets

I/O CONNECTOR FOR ADD IN PRINTED CIRCUIT CARDS FOR COMPUTER SYSTEMS

Please refer to co-pending application Ser. No. 08/330,250 filed on Dec. 26, 1994 by Michael E. Pierce and David C. Scheer.

BACKGROUND OF THE INVENTION

1. Field of the Invention

The subject invention relates to printed circuit cards for add in I/O functions for computer systems. More particularly, the invention relates to an improved I/O connector for interfacing to external devices and networks through the RJ type connectors.

2. Description of the Prior Art

The PCMCIA (Personal Computer Memory Card International Association) standard was developed for the purpose of providing user installed memory and I/O functions for small form factor digital computer systems. The standard specifies a card containing a printed circuit board. This product is usually referred to as a PC card. There are three PC card formats: Types I, II and III. All three have external dimensions of 54 millimeters by 85.6 millimeters. Thicknesses vary. Type I is 3.3 millimeters thick. Type II is 5 millimeters thick. Type III is 10.5 millimeters thick. The standard specifies a 68 position socket on one end of the card. The 68 position socket mates with a 68 position plug mounted on a header which is in turn mounted to a mother board or daughter board which is located inside the host. There is a wide variation of headers in use including headers for different thickness cards; however, the 68 pin connector is common to all PCMCIA cards. The PCMCIA standard specifies the function of each of the 68 pins in the connector. The standard supports either an 8 bit or 16 bit bus. There are four ground pins, two power pins and up to 3 free signal pins for additional functions.

The original PC cards were intended to provide additional memory. No interaction with external devices was contemplated. Later, I/O cards were developed to add functions such as modems, facsimile, network interfaces, multi-media interface, sound cards, etc. In order to handle I/O functions, a second connector is located on the end of the card opposite the 68 position socket. The I/O connector reaches the outside world through a cable.

A communications card such as a modem or network interface must be connected to a network. The telephone network uses the RJ-11 modular jack for connecting individual telephones to the network and local area networks ("LAN") use RJ-45 modular jacks. The RJ-type jack is large compared to the card. It is thus difficult to attach to a card. To get around this problem, manufacturers have supplied custom adapter and cable assemblies. The adapter and cable assembly consists of a short cable with connector on both ends. One of the connectors was the plug of a RJ-type modular jack and the other connector was typically one end of a custom connector small enough to attach to the card. One problem with this approach is that the adaptor and cable assembly is often forgotten which makes the communication card useless. But, if the assembly is permanently attached to the card, it is frequently broken since their small size make them fragile. Thus, manufacturers have been seeking ways to provide an adaptor and cable assembly or its functional equivalent which is integral to the card and still robust.

One prior art approach to solving this problem is provided by U.S. Pat. No. 5,183,404, entitled SYSTEMS FOR CONNECTION OF PHYSICAL/ELECTRICAL MEDIA CONNECTORS TO COMPUTER COMMUNICATIONS CARDS and issued to Aldous et al which shows the use of a retractable RJ-type socket which stores within the body of the card when not in use.

A second problem with the communication card connectors is that the RJ-type jacks were not designed for frequent insertions and removals. The RJ-type jacks use a flexible locking mechanism to hold the plug into the socket. This design works well for stationary appliances such as telephones which require infrequent connections. But in today's mobile environment, the connect/disconnect action is frequent. And the locking mechanism on the RJ-type jack regularly breaks when subjected to regular connects and disconnects.

Yet another problem is the fact that the locking feature of the RJ-type jack means that it will not disconnect when subjected to a firm tug such as might happen when the user trips over the telephone wire. When this happens, the appliance to which it is attached is yanked off of a table onto the floor and sometimes broken or the RJ-type jack is broken rendering the appliance useless until the jack is replaced.

OBJECTS

It is therefore an object of this invention to provide an improved communications card connector design.

It is another object of the invention to provide a design that will stand up to a high frequency of connections and disconnections.

It is another object of the invention to provide a design that is mechanically and electrically robust.

It is another object of the invention to provide a design that will automatically disconnect when subjected to a sharp tug.

It is yet another object of the invention to provide a communications card connector design that may be rotated to accommodate a RJ-type plug near its base to allow a broader base of compatible systems.

It is an object of this invention to provide an improved communications card connector design that folds out of the way inside of the host appliance when not in use.

SUMMARY OF THE INVENTION

These and other objects of the invention can be achieved by an add in PC card for supplying network communications functions to a host computer wherein the connector to the network is a RJ type universal jack consisting of a socket and plug. The PC card has a substantially rectangular top view with a long and short dimension and includes a frame that surrounds and at least partially supports a printed circuit board which contains the communications functionality. Top and bottom covers are attached to the frame and surround the printed circuit board. A first connector is mounted to the frame along one of the short dimensions and is connected to the printed circuit board. A cavity in the card is formed by an opening in the short dimension of the frame opposite the first connector and the top and bottom covers. A carriage is mounted in the cavity so that it can slide in and out and occupy at least two positions. The carriage consists of a socket portion for making contact with the RJ type plug and a support and contact portion that mechanically supports the carriage within the card and also makes the electrical contact between the carriage and the card. In the first of the two positions, substantially all of the carriage is within the cavity. In the second of the two positions, the socket portion of the carriage is outside of the cavity. In this position, the socket is electrically connected to the printed circuit board. The socket is designed to mate with the RJ type plug and retain the plug in electrical contact with the socket by means of a spring member. The result is that the plug will separate from the socket as the result of a predetermined force being applied to the plug and avoid breaking either the jack or the host.

The socket may consist of a tray having a rectangular bottom, a base member attached to and extending upwardly from the bottom along one side and a side member on either side of the base member. Each member is attached to and extending upwardly from the bottom. A deformable clip is attached to the bottom and extends upwardly from the bottom on the side opposite from the base member. A plurality of points are mounted to the base member and fit into depressions in the plug and thereby lock the front of the plug to one end of the tray. Instead of points, a rotatable flap may be attached by hinges to one end of the tray. The flap has tabs that extend outwardly from the flap at a substantially right angle or greater and engage the top and front of the plug.

Also the carriage may be completely removed from the cavity rotated 180° around its long axis and reinserted in the cavity. The carriage is designed such that the electrical contacts between the carriage and card are made regardless of which way the carriage is inserted into the cavity. Alternatively, the socket may be made in the form of an adapter that can be mechanically and electrically connected to the carriage by a custom symmetrical connector.

The socket may be a spring deformable frame of a shape to mate with the plug when the plug is inserted at substantially 90° to the frame, the spring action of the frame holds the plug in place. A detent located on the frame fits into a slot in the plug and locates the plug so that the contacts on the plug mate with the contacts on the frame.

The frame may consist of a base member, first and second L-shaped members attached to the base member to form a rectangular shaped opening. A detent is spring mounted on the base and extends into the rectangular shaped opening, the detent moves in a direction out of the rectangular opening when the plug is inserted until the detent seats into a slot in the plug. Alternatively, the frame may consist of a pair of U-shaped members each having a center and two arms. Springs connect the arms of the two U-shaped members to form a rectangular opening for receiving the plug. The contacts and a detent are attached to the center portion of one of first U-shaped members.

Instead of having a cavity and a carriage, a second socket may be rotatably mounted to the frame on the short dimension opposite the first socket. The second socket is attached by hinges so that it may rotate with respect to the short axis of the card. In one position, the socket is an extension of the dimensions of the card. In a second position the socket folds back on the card and is not an extension of a dimension of the card.

BRIEF DESCRIPTION OF THE DRAWING

The invention will now be described in conjunction with the Drawing wherein.

DESCRIPTION OF THE PREFERRED EMBODIMENT

Figure 1:
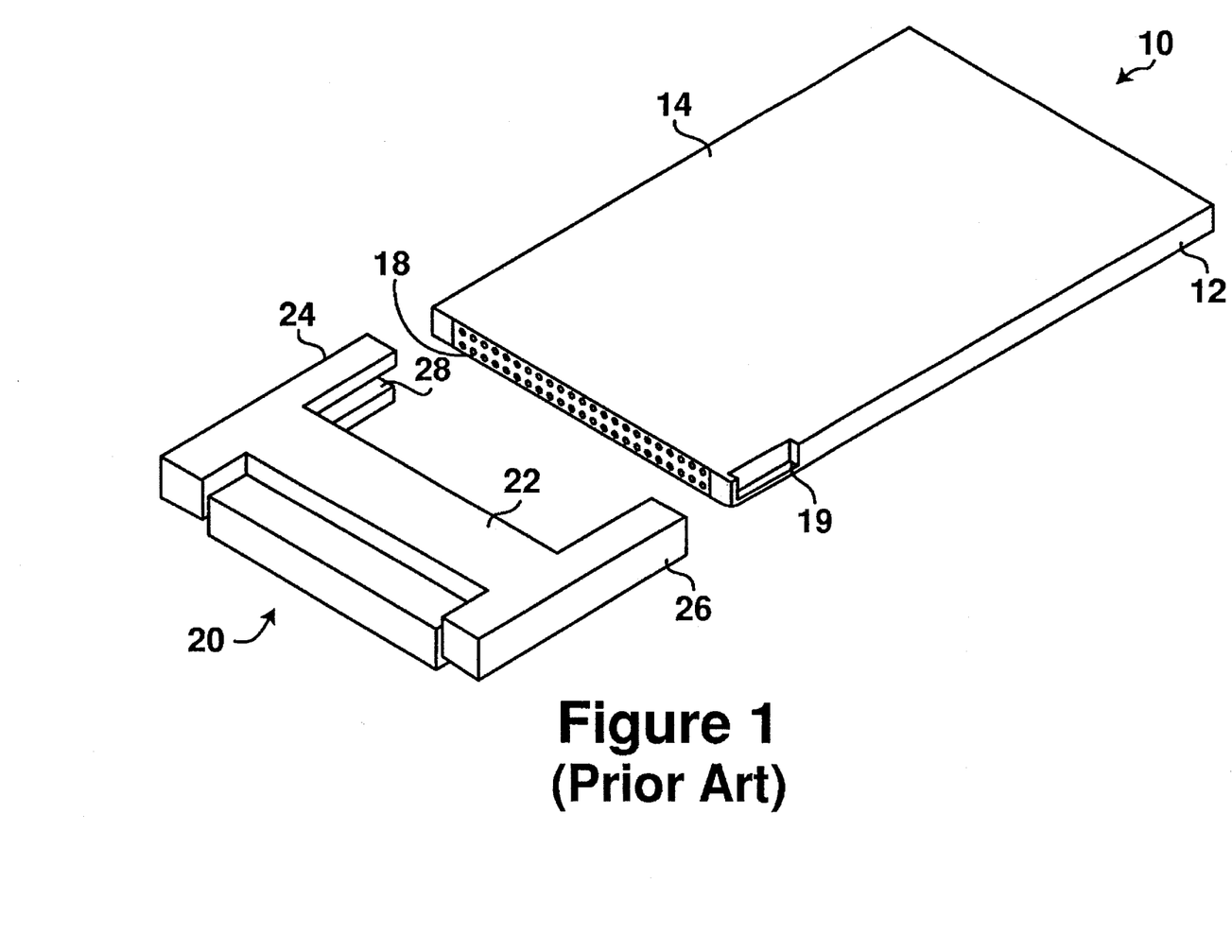
FIG. 1 is a perspective view of a prior art card and header assembly that conforms to the PCMCIA standard.

FIG. 1 is a perspective view of a prior art card that conforms to the PCMCIA standard. Referring now to FIG. 1, a card 10 consists of a printed circuit board which contains the electronic components and interconnect circuitry needed to create a subsystem that performs the functions for which the card was designed. A frame 12, a top cover 14 and a bottom cover 16 (not shown in this Figure) surround the printed circuit board. A 68 position socket 18 is fitted into one of the short dimension edges of frame 12. A key 19 is formed in one edge of frame 12 to provide card orientation.

Header 20 is a U shaped member having a base element 22 and two side elements 24 and 26. Side elements 24 and 26 have a slot 28 and 30 (not shown) respectively on their internal side. The interior dimension of header 20 and slots 28 and 30 are such as to receive card 10 in a sliding fit. Header 20 is typically bonded to the mother board of the host digital computer system for which card 10 is intended as an add in function.

A 68 position plug is adapted to fit into 68 position socket 18 when card 10 is fully inserted into header 20. Leads from the pins pass through base 22 of header 20 and are ultimately connected to a printed circuit board residing in the host digital computer system.

Figure 2:
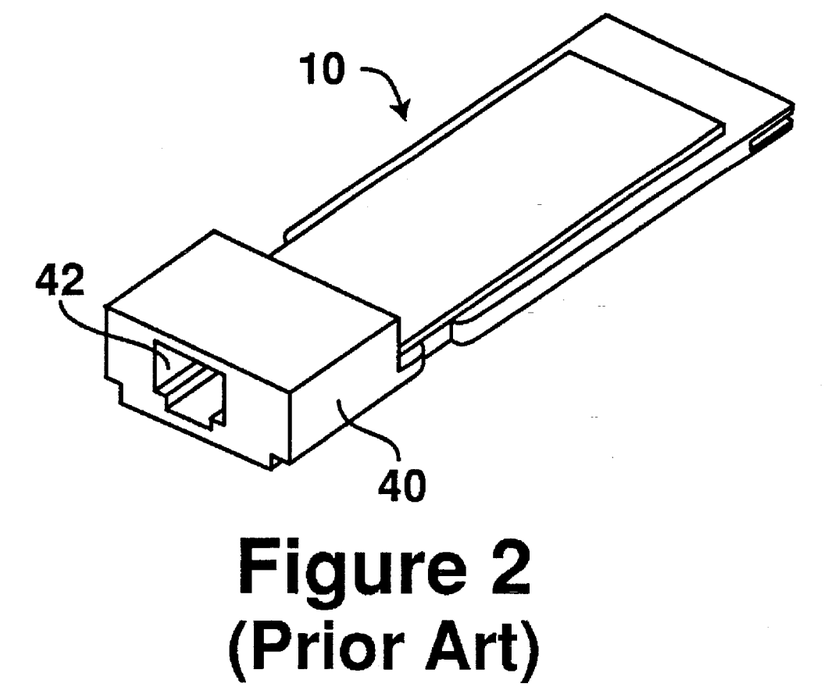
FIG. 2 is a perspective view of a prior art PCMCIA card with a RJ-type jack built into one end.

FIG. 2 is a perspective view of a Type II PCMCIA card with a RJ-11 socket mounted on one end. Referring now to FIG. 2, RJ-11 socket 40 is attached to one end of PCMCIA card 10. Socket 40 generally includes an aperture 42 having a specific shape called for by the RJ-11 standard. As can be seen, socket 40 is much larger than card 10. As a result, socket 40 tends to break away from card 10 and at a minimum makes the storage of card 10 more difficult.

Figure 3:
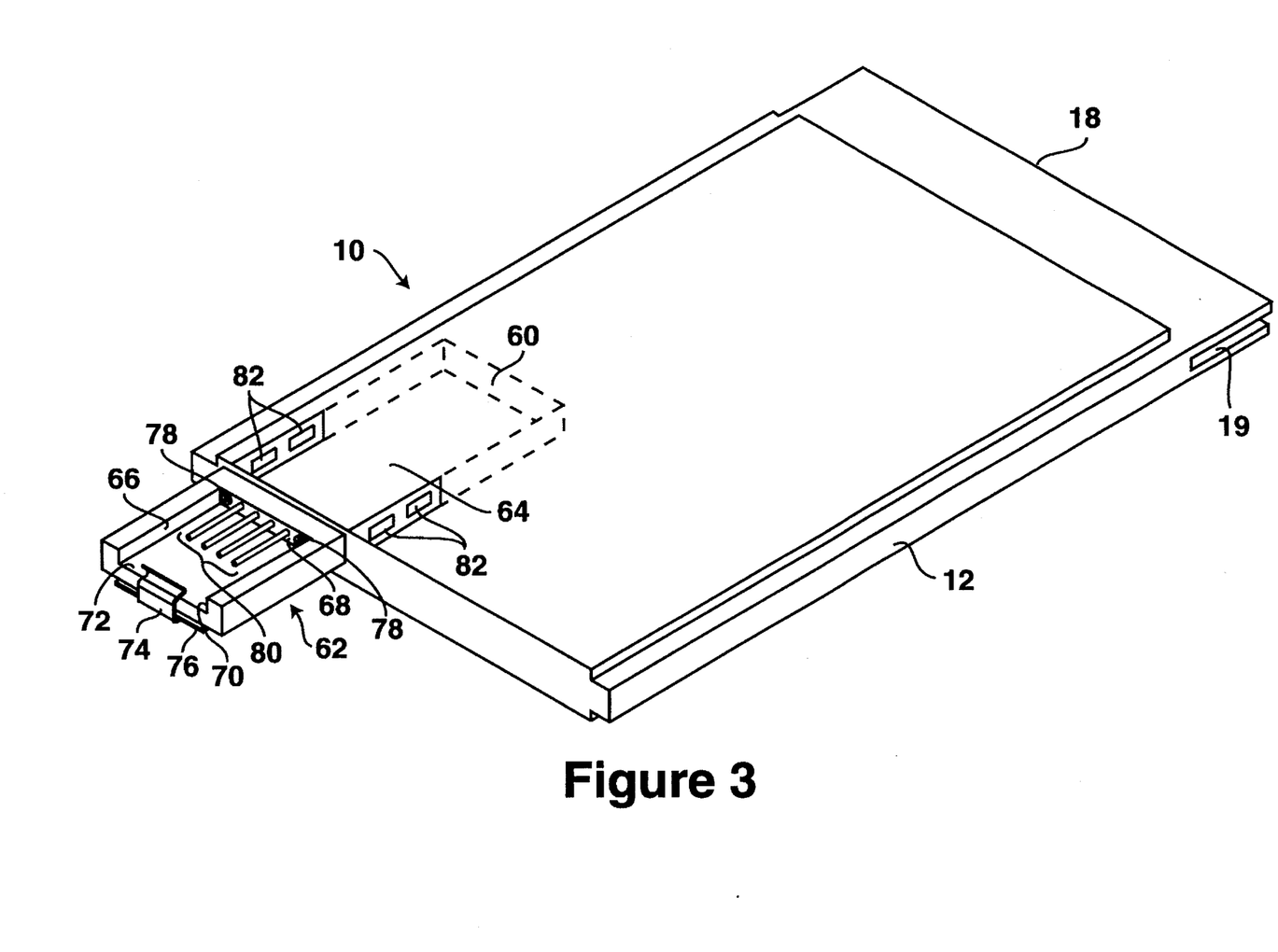
FIG. 3 is a Type II PCMCIA card with a RJ-11 tray type socket with points in one side to restrain on end of the plug.

FIG. 3 is a perspective view of a tray type socket for a RJ-11 jack made according to the present invention. Referring now to FIG. 3, card 10 has a rectangular shaped cavity 60 into which a carriage fits in a sliding relationship. The carriage has a tray type socket portion 62 and a mechanical support and electrical connect portion 64. The carriage may slide in and out of cavity 60 and occupy at least two positions. In one position, substantially all of the carriage is within cavity 60. In a second position, tray portion 62 is completely outside of cavity 60 (as illustrated in FIG. 3). Tray 62 is formed by side members 66, and 68, a base member 70, and a bottom plate 72. A mechanically deformable clip 74 forms the fourth side. Clip 74 may be stamped from any number of well known springy metals in a single piece consisting of a flange 76 and clip 74. Flange 76 is attached to the underside of bottom plate 72. Two points 78 are mounted to side 68 and extend outwardly therefrom. Points 78 are made of a hard material such as a metal or hard plastic. Points 78 may mate with two small recesses in the RJ-11 plug or may form their own recesses in the relatively soft plastic of a RJ-11 plug and thereby lock the front of the plug to tray 62. Electrical conductors 80 are positioned to mate with the plug of a RJ-11 jack. Electrical conductors 80 pass through base member 70 and make electrical contact with sliding contacts 82 in mechanical support and electrical contact portion 64 of the carriage. Sliding contacts in turn are electrically connected with the card's functional electronic circuitry.

Figure 4:
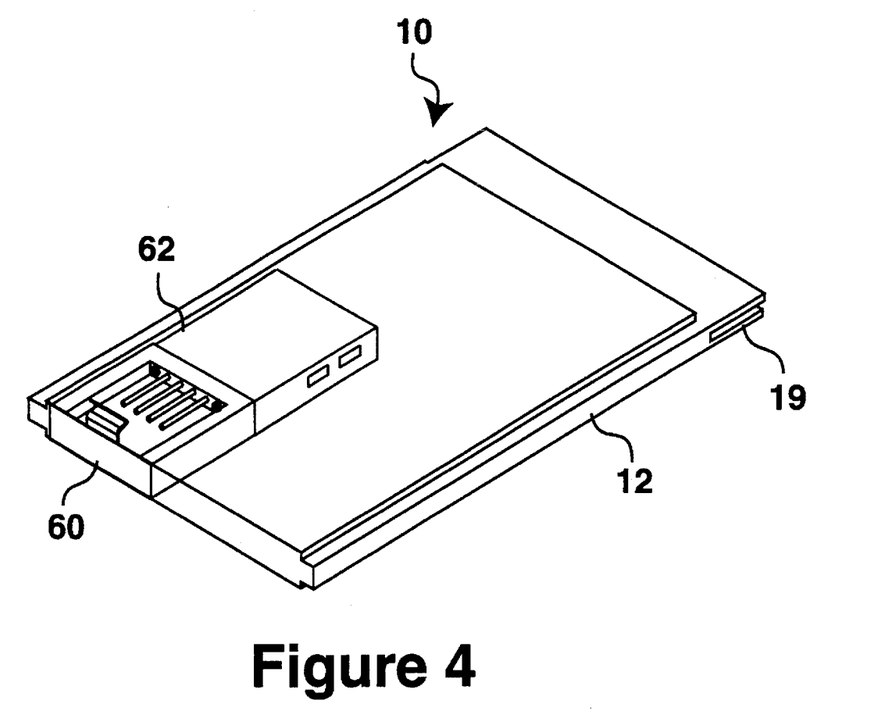
FIG. 4 is a perspective view of the PCMCIA card of FIG. 3 in its storage position.

FIG. 4 shows tray 62 in the position it would take while not in use. As can be seen, tray 62 is physically safe and out of the way while not in use and since it is integral to card 10, it can never be left behind.

Figure 5:
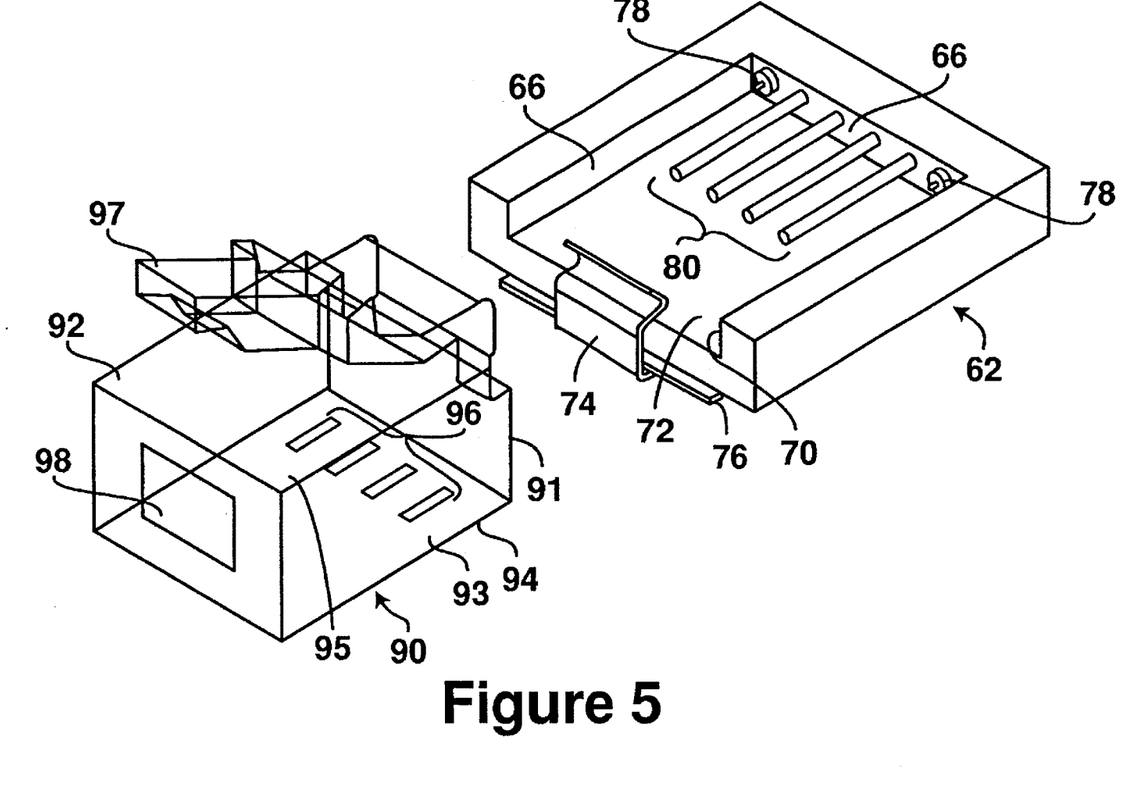
FIG. 5 is a perspective view of a RJ-11 plug adjacent to a tray.

FIG. 5 is a perspective view showing how a RJ-11 plug mates with the RJ-11 tray-socket formed by sides 66,68 and 70, clip 74 and points 78. Referring now to RJ-11 plug 90 consists of a housing with a front face 91, side faces 92 and 93, a bottom 94 and a top 95. Plug 90 includes, schematically shown, electrical contacts 96 that mate with electrical contacts 80 in tray 62. A flexible locking mechanism 97 which is required with the prior art RJ-11 connector system is not functional in the present invention. Cavity 98 allows access to electrical contacts 96. Typically a multi-conductor cable is inserted into plug 90 thorough cavity 98, and contact is made with a crimping tool.

When plug 90 is placed in tray 62, points 78 burrow into the relatively soft plastic of front face 91 of plug 90. This holds the front end of plug 90 in place. Clip 74 fits into cavity 98 and holds the rear of plug 90 in place. Electrical contacts 80 and 96 make electrical contact.

Plug 90 is inserted into tray 62 by positioning front face 91 against side 66 and pushing plug 90 downward toward base 70. As this is done, mechanically deformable clip 74 deforms outwardly from its base position, which is vertical to the sides of tray 62, until bottom 94 of plug 90 rests on bottom 72 of tray 62. In this position, clip 74 fits into cavity 98 in its base position.

Figure 6:
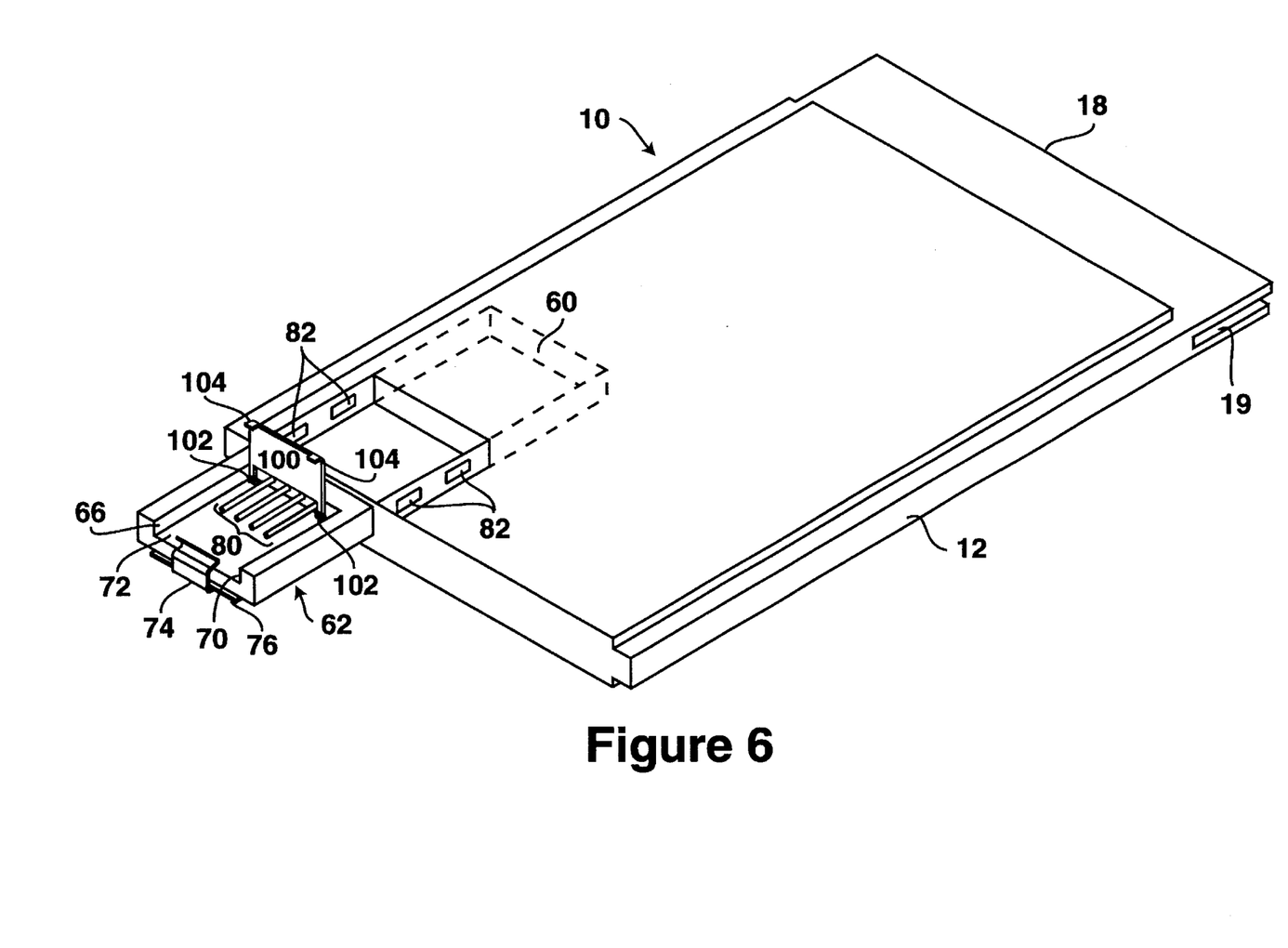
FIG. 6 is PCMCIA card with a RJ-11 tray type socket with clips to restrain one end of the RJ-11 plug.

FIG. 6 shows a second embodiment of the RJ-11 socket described in connection with FIG. 3. Referring now to FIG. 6, instead of using points 78 to lock the front of RJ-11 plug into place, a rigid flap 100 is rotatably mounted to sides 66 and 70 by hinges 102. Hinges 102 are located the proper distance from front 68 of tray 62 such that the RJ-11 plug fits snugly between flap 100 and clip 74. Flap 100 has tabs 104 extending at approximately right angles from its top edge. Tabs 104 lock the front of the RJ-11 plug into tray 62. Thus, when there are no forces or only small forces on the RJ-11 plug, it is retained in tray 62 by a combination of flap 100, tabs 104 and clip 74. However, when a sufficient force is exerted on the RJ-11 plug 90, clip 74 bends backward and allows the plug to come away from tray 62. This avoids possible damage of the host. When card 10 is not in use, flap 100 folds down over connectors 80 and the carriage slides into cavity 60 of card 10 as shown in FIG. 4.

Figure 7:
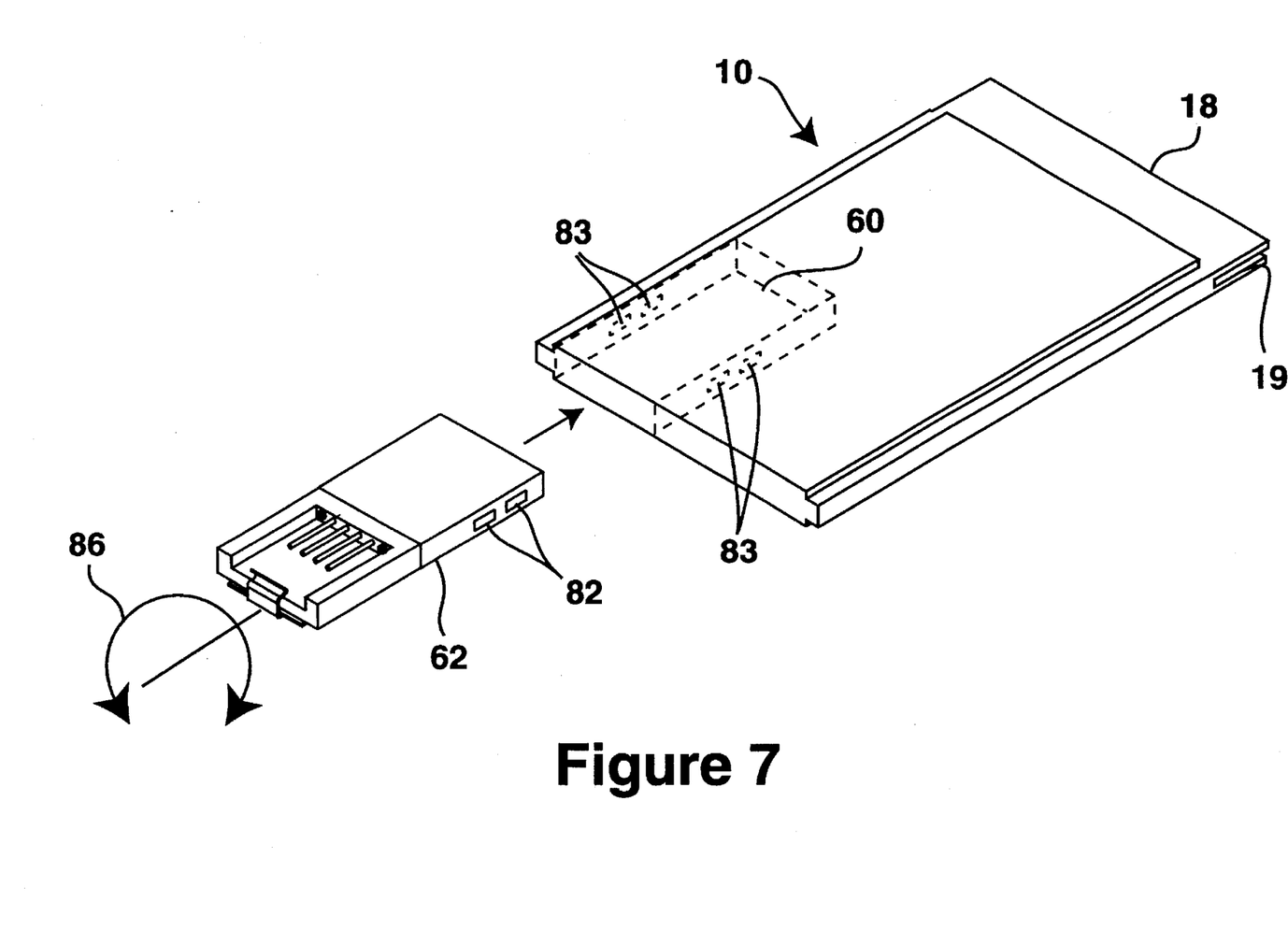
FIG. 7 is a perspective view of a PCMCIA card with a RJ-11 tray type socket that is retractable and rotatable.

As can be seen from FIGS. 2 and 5, the RJ-11 plug 90 when inserted into tray 62 protrudes up a substantial distance above the top surface of card 10. If the opening in the host computer for card 10 is closer to the bottom surface of the host than the distance that plug protrudes above the top surface of card 10, and if the protruding portion of RJ-11 plug is oriented downward with respect to the host when connected to tray 62, then the host cannot sit evenly on a flat surface such as a table. FIG. 7 is intended to illustrate yet another aspect of the present invention which solves this problem. Referring now to FIG. 7, the carriage which includes tray 62 and support and connector portion 64 is removable from cavity 60 and may be rotated 180° as indicated by arrow 86 around the long axis and reinserted. To do this, sliding contacts 82 on support and connector portion 64 of the carriage and sliding contacts 83 on the inner surfaces of cavity 60 are located such that they will mate regardless of which orientation the carriage is in. Thus, regardless of which orientation card 10 is forced to take upon insertion into the host (connector 18 is not symmetrical), tray 62 may be oriented to allow the RJ-11 plug to face up.

Figure 8:
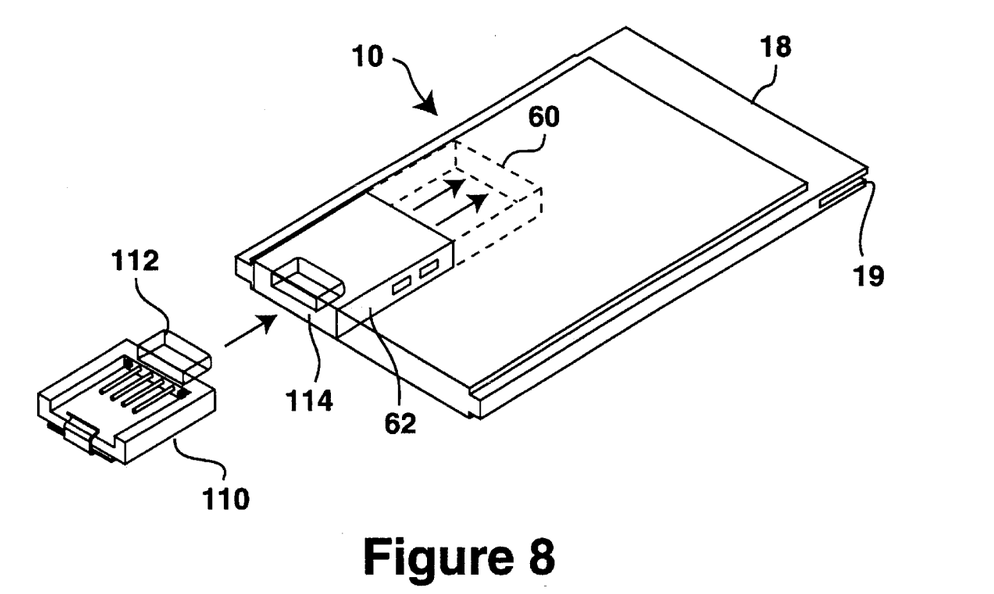
FIG. 8 is a perspective view of a PCMCIA card with a RJ-11 tray type socket in the form of a small adapter that is retractable and rotatable.

FIG. 8 is a perspective view of an alternative embodiment of the invention dealing with the orientation of the RJ-11 plug. In this embodiment, the carriage is not removable. However, tray 62 is in the form of a plugable adaptor 110. Adaptor 110 has a plug 112 which mates with socket 114 in the carriage. Adaptor 110 may be removed, rotated 180° and reconnected. When not in use, plug 112 and socket 114 are joined and the carriage is completely inserted in cavity 60. In this way, adaptor 110 will not be lost.

Figure 9:
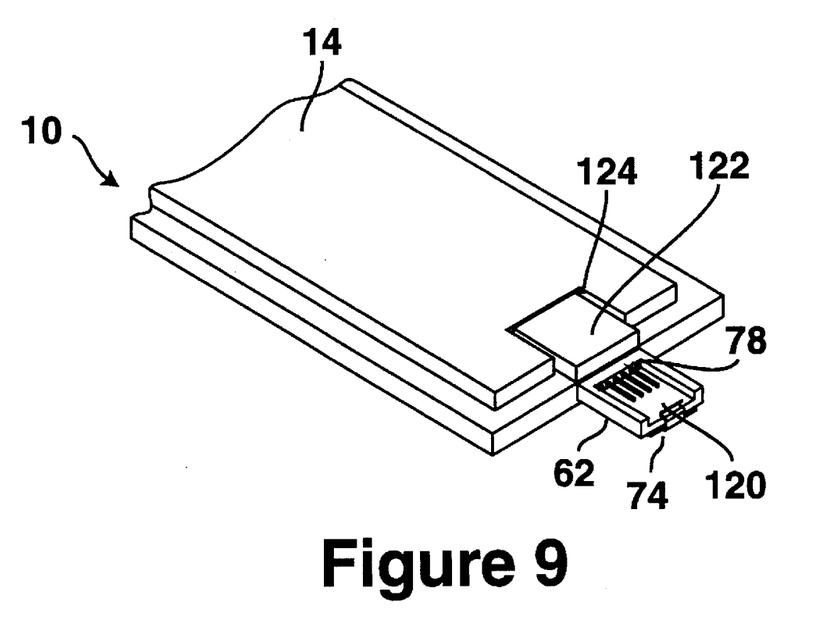
FIG. 9 is a perspective view of a PCMCIA card with a RJ-11 socket that folds back on the card when not in use.

FIG. 9 is a perspective view of another embodiment of the present invention. Referring now to FIG. 9, a tray-socket 62 is shown in the operating position at reference numeral 120. Tray 120 is rotatably mounted to card 10 by hinges (not shown). Tray 62 is shown folded onto card 10 at reference numeral 122. Tray 62 is substantially identical to tray 62 described in connection with earlier Figures. However instead of being part of a carriage that slides into card 10 when not in use, it folds over the top of card 10. To accomplish this, it may be necessary to cut out a portion of top 14 as shown at reference numeral 124. With tray 62 in the folded position, card 10 fits into the host computer. To use, tray 62 is folded into the in use position and card 10 is then reinserted into the host. Then, the plug of a RJ-11 jack is inserted into tray socket 62 to make connection to the telephone network.

Figure 10:
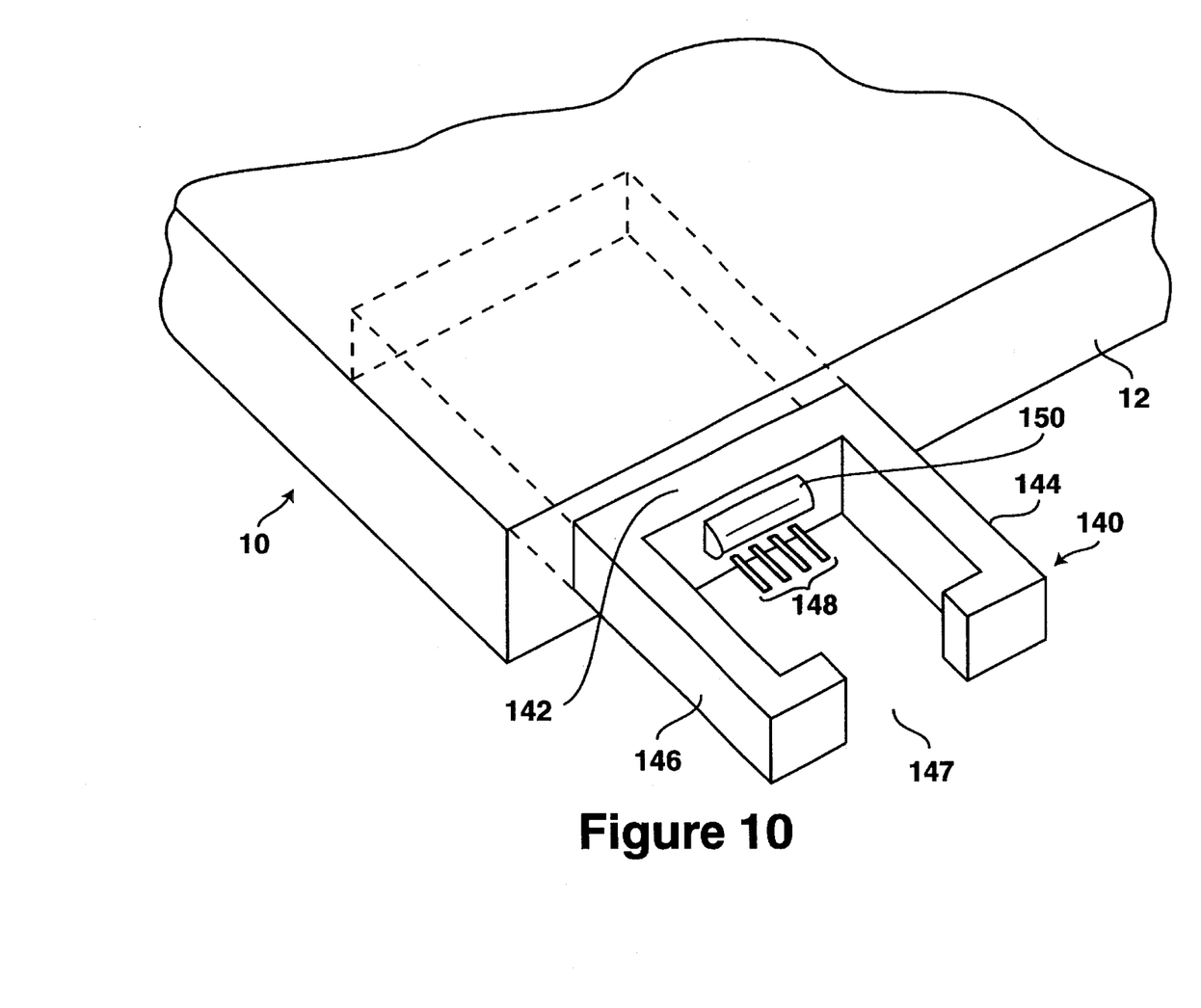
FIG. 10 is a perspective view of a PCMCIA card with a RJ-11 socket for vertical insertion of a RJ-11 plug without locking mechanism, but having a positive detent.

FIG. 10 is a perspective view of another embodiment of the present invention. Referring now to FIG. 10, RJ-11 socket 140 consists of a frame which is comprised of a base member 142 and two L-shaped side members 144 and 146 each having a long and short dimension. The short dimensions of side members 144 and 146 form the fourth side of the frame which then includes a gap 147. Base member 142 may be attached to frame 12 of card 10 or it can be made an integral part of the carriage. Electrical contacts 148 extend outwardly from base member 142 and make contact with the corresponding electrical contacts of an inserted RJ-11 plug. Electrical contacts 148 extend through base member 142 and make contact with the circuitry of card 10. Base member also includes a deformable positive detent 150.

Figure 11:
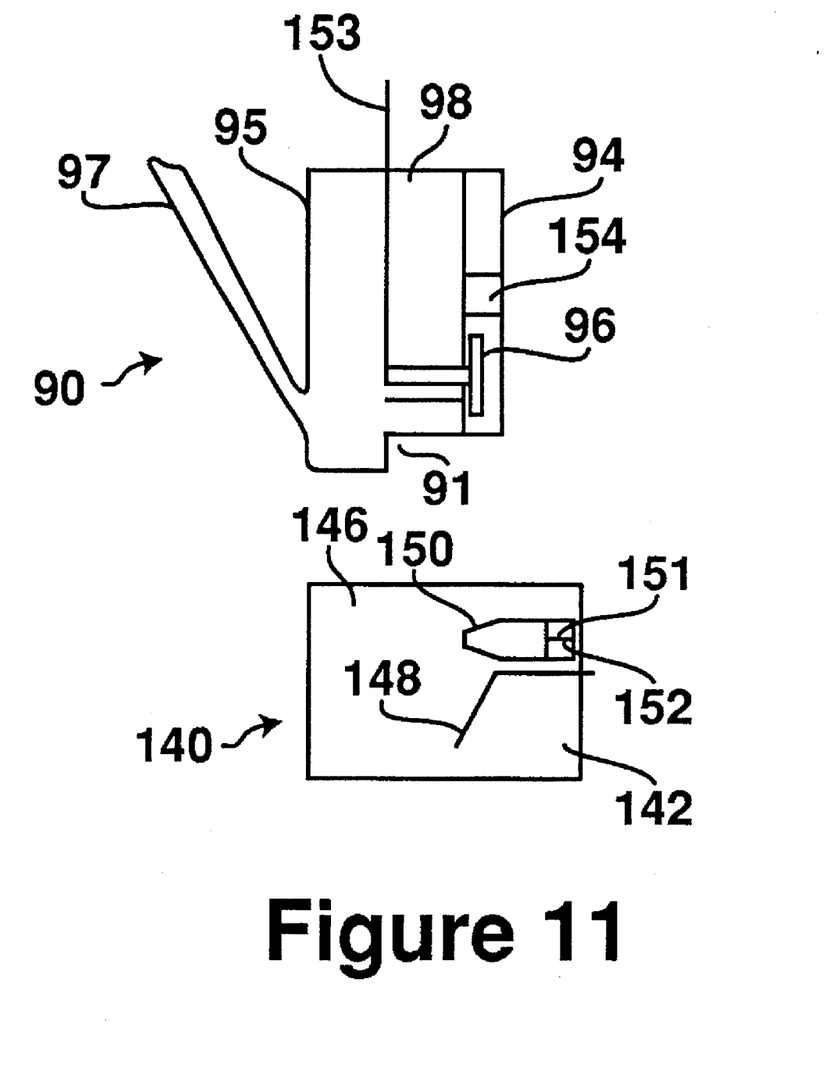
FIG. 11 is a cross-sectional view taken through FIG. 10 and through a typical RJ-11 plug.

FIG. 11 is a cross sectional view through FIG. 10 and through a typical RJ-11 plug. Reference numerals in FIG. 11 previously recited in other figures refer to the same part. Referring now to FIG. 11, positive detent 150 slides in and out of slot 151 and is biased outwardly by spring 152.

RJ-11 plug 90 includes electrical contact 96 which is electrically connected to a multi conductor cable 153 which turn is connected to a network. A cavity 154 is open at the bottom 94 of plug 90.

A conventional RJ-11 plug 90 fits vertically into the frame formed by base member 142 and side members 144 and 146. Upon insertion, positive detent 150 slides back into slot 151 until plug 90 is inserted sufficiently to allow spring 152 to urge positive detent 150 into cavity 154 in plug 90. At this point contacts 148 mate with contacts 96 on plug 90. Plug 90 is both positioned within the frame and held in place when positive detent 150 slides into cavity 154. Again, there is no reliance on flexible locking mechanism 97. When plug 90 is removed, again positive detent 150 slides back into slot 151 as plug 90 is removed. Instead of using a spring mechanism, positive detent 150 may also be made of a deformable material. Plug 90 will also come loose in case of a sudden force such as tripping over the telephone wire.

Figure 12:
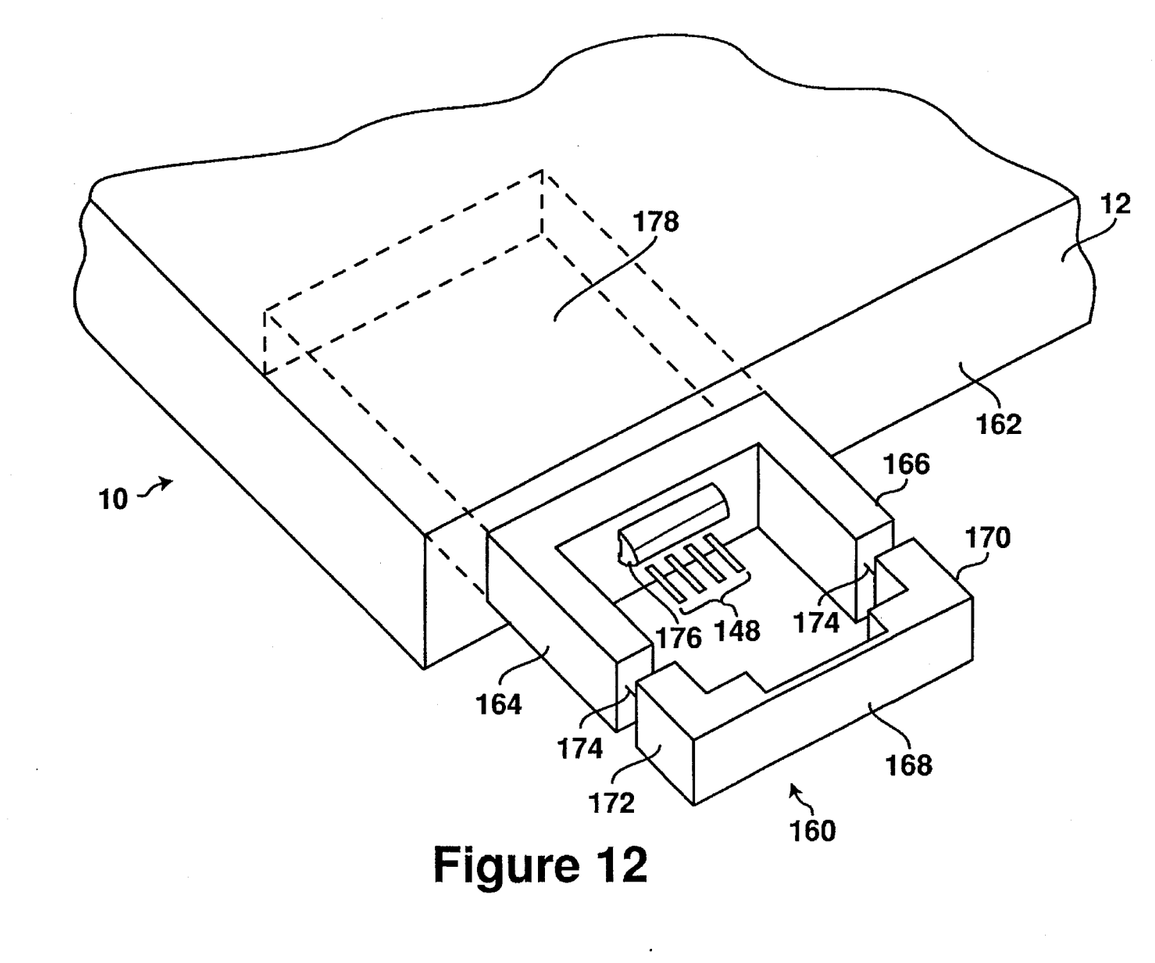
FIG. 12 is a perspective view of a PCMCIA card with a RJ-11 socket for vertical insertion of a RJ-11 plug a without a locking mechanism, having a two piece, spring joined housing.

FIG. 12 is a perspective view of another embodiment of the present invention. Referring now to FIG. 12, a RJ-11 socket consists of frame 160 which is comprised of a first U-shaped member having a base 162 and two arms 164 and 166. A second U-shaped member consists of a back portion 168 two arms 170 and 172. Arms 164 and 166 are connected to arms 170 and 172 by springs 174. Detent 176 in this case need not be deformable since deformation on the insertion and removal operations is taken care of by the fact that the two U-shaped members that form the frame are spring mounted. When not in use, frame 160 is inserted into channel 176 in card 10.

The foregoing preferred embodiment is subject to numerous adaptations and modifications without departing from the scope of the invention. Therefore, within the scope of the appended claims, the invention may be practiced other than as specifically described herein.

What is claimed is:

1. An add in PC card for supplying network communications functions to a host computer wherein the connector to the network is a RJ type universal jack consisting of a socket and plug, said PC card comprising:

a frame having a substantially rectangular top view with a long and short dimension surrounding and at least partially supporting a printed circuit board:

top and bottom covers attached to said frame and surrounding said printed circuit board;

a first connector mounted to said frame along one of said short dimensions and connected to said printed circuit board;

a cavity in said card formed by an opening in the short dimension of said frame opposite said first connector and said top and bottom covers;

a carriage having a socket portion and a support and contact portion, said carriage being slidably mounted in said cavity and movable with respect thereto into at least a first position wherein substantially all of said carriage is within said cavity and a second position wherein said socket portion of said carriage is outside of said cavity and said socket is electrically connected to said printed circuit board, said socket being adapted to mate with said RJ type plug and retain said plug in electrical contact with said socket by means of a spring member whereby said plug separate from said socket as the result of a predetermined force being applied to said plug.

2. The add in PC card of claim 1 wherein said socket portion comprises:

a tray having a rectangular bottom, a base member attached to and extending upwardly from said bottom along one side thereof a side member on either side of said base member, each attached to and extending upwardly from said bottom;

means attached to said base member for locking one end of said plug into said tray; and spring means attached to said bottom for holding the opposite end of said plug in said tray; and contact means attached to said tray and located so as to connect with the contacts in said plug when said plug is seated in said tray.

3. The add in PC card of claim 2 wherein said socket is mechanically and electrically separable from said carriage and symmetrical around the long axis thereof whereby said socket is functional in said second position regardless of its orientation around said axis with respect to said cavity.

4. The add in PC card of claim 2 wherein said socket comprises a spring deformable adapted to mate with said plug when said plug is inserted at substantially 90° to said frame, the spring action of said frame holding said plug in place.

5. The add in PC card of claim 4 wherein said frame comprises:

a base member;

first and second L-shaped members attached to said base member to form a rectangular shaped opening;

a detent spring mounted on said base and extending into said rectangular shaped opening, said detent being adapted to move in a direction out of said rectangular opening in response to a force received from the insertion of said plug.

6. The add in PC card of claim 4 wherein said frame comprises:

a first U-shaped member having a center and two arm portions;

a second U-shaped member having a center and two arm portions;

spring means connecting said the arms of first and second U-shaped members to form a rectangular opening for receiving and mating with said plug;

a non detent attached to the center portion of said first U-shaped member;

contacts attached to the center portion of said first U-shaped member.

7. The add in PC card of claim 2 wherein said spring means comprises a deformable clip attached to said bottom and extending upwardly therefrom on the side opposite from said base member.

8. The add in PC card of claim 7 wherein said locking means comprise a plurality of points mounted to one end of said tray.

9. The add in PC card of claim 7 wherein said locking means comprises a rotatable flap attached by hinges to one end of said tray, said flap being characterized by tabs that extend outwardly from said flap at a substantially right angle or greater and engage the top of said plug.

10. The add in PC card of claim 1 wherein said carriage is completely removable from said cavity and is symmetrical around its long axis with respect to said cavity whereby said socket is functional in said second position regardless of its orientation around said axis with respect to said cavity.

11. An add in PC card for supplying network communications functions to a host computer wherein the connector to the network is a RJ type universal jack consisting of a socket and plug, said PC card comprising:

a frame having a substantially rectangular top view with a long and short dimension surrounding and at least partially supporting a printed circuit board:

top and bottom covers attached to said frame and surrounding said printed circuit board;

a first connector mounted to said frame along one of said short dimensions and connected to said printed circuit board;

a RJ type socket rotatably mounted to said frame on the short dimension thereof opposite said first connector and electrically connected to said printed circuit board, said socket being rotatable with respect to the short axis of said card into at least a first position wherein said connector is an extension of the dimensions of said card and a second position wherein said connector folds back upon said card and is not an extension of a dimension of said card.

12. The add in PC card of claim 11 wherein said socket comprises:

a tray having a rectangular bottom, a base member attached to and extending upwardly from said bottom along one side thereof a side member on either side of said base member, each attached to and extending upwardly from said bottom;

means attached to said base member for locking one end of said plug into said tray; and spring means attached to said bottom for holding the opposite end of said plug in said tray; and contact means attached to said tray and located therein so as to connect with the contacts in said plug when said plug is seated in said tray.

13. The add in PC card of claim 12 wherein said socket is mechanically and electrically separable from said carriage and symmetrical around the long axis thereof whereby said socket is functional in said second position regardless of its orientation around said axis with respect to said cavity.

14. The add in PC card of claim 12 wherein said socket comprises a spring deformable adapted to mate with said plug when said plug is inserted at substantially 90° to said frame, the spring action of said frame holding said plug in place.

15. The add in PC card of claim 14 wherein said frame comprises:

a base member;

first and second L-shaped members attached to said base member to form a rectangular shaped opening;

a detent spring mounted on said base and extending into said rectangular shaped opening, said detent being adapted to move in a direction out of said rectangular opening in response to a force received from the insertion of said plug.

16. The add in PC card of claim 15 wherein said frame comprises:

a first U-shaped member having a center and two arm portions;

a second U-shaped member having a center and two arm portions;

spring means connecting said the arms of first and second U-shaped members to form a rectangular opening for receiving and mating with said plug;

a non detent attached to the center portion of said first U-shaped member;

contacts attached to the center portion of said first U-shaped member.

17. The add in PC card of claim 12 wherein said spring means comprises a deformable clip attached to said bottom and extending upwardly therefrom on the side opposite from said base member.

18. The add in PC card of claim 13 wherein said locking means comprise a plurality of points mounted to one end of said tray.

19. The add in PC card of claim 17 wherein said locking means comprises a rotatable flap attached by hinges to one end of said tray, said flap being characterized by tabs that extend outwardly from said flap at a substantially right angle or greater and engage the top of said plug.

* * * * *

UNITED STATES PATENT AND TRADEMARK OFFICE
CERTIFICATE OF CORRECTION

PATENT NO. : 5,477,418
DATED : December 19, 1995
INVENTOR(S) : MacGregor et al.

It is certified that error appears in the above-indentified patent and that said Letters Patent is hereby corrected as shown below:

In column 10, line 35, delete "claim 13" and insert --claim 17--.

Signed and Sealed this

Sixth Day of August, 1996

Attest:

BRUCE LEHMAN

*Attesting Officer*     *Commissioner of Patents and Trademarks*